United States Patent
Lakrout et al.

(10) Patent No.: US 8,440,097 B2
(45) Date of Patent: May 14, 2013

(54) STABLE, CONCENTRATABLE, WATER SOLUBLE CELLULOSE FREE CHEMICAL MECHANICAL POLISHING COMPOSITION

(75) Inventors: Hamed Lakrout, Midland, MI (US); Jinjie Shi, Midland, MI (US); Joseph Letizia, Philadelphia, PA (US); Xu Li, Potomac, MD (US); Thomas H. Kalantar, Midland, MI (US); Francis Kelley, Smyrna, DE (US); J. Keith Harris, Midland, MI (US); Christopher J. Tucker, Midland, MI (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 217 days.

(21) Appl. No.: 13/039,705

(22) Filed: Mar. 3, 2011

(65) Prior Publication Data

US 2012/0225556 A1 Sep. 6, 2012

(51) Int. Cl.
*C09K 13/00* (2006.01)

(52) U.S. Cl.
USPC ........ 252/79.1; 252/79.2; 252/79.3; 438/691; 438/692; 216/89

(58) Field of Classification Search .................. 438/691, 438/692, 693; 252/79.1, 79.2, 79.3, 79.4; 216/88, 216/89, 90
See application file for complete search history.

(56) References Cited

U.S. PATENT DOCUMENTS

| | | | |
|---|---|---|---|
| 6,375,693 B1 | 4/2002 | Cote et al. | |
| 6,632,259 B2 | 10/2003 | Weinstein et al. | |
| 6,632,377 B1 | 10/2003 | Brusic et al. | |
| 6,679,928 B2 | 1/2004 | Costas et al. | |
| 7,303,993 B2 | 12/2007 | Kelley et al. | |
| 7,384,871 B2 | 6/2008 | Kelley et al. | |
| 7,824,568 B2 | 11/2010 | Comeau et al. | |
| 2002/0066234 A1 | 6/2002 | Cote et al. | |
| 2006/0000808 A1* | 1/2006 | Seki et al. ........................ | 216/88 |
| 2009/0215266 A1 | 8/2009 | Thomas et al. | |
| 2010/0029079 A1 | 2/2010 | Ghosh et al. | |
| 2010/0075500 A1* | 3/2010 | Yoshikawa et al. ........... | 438/692 |

* cited by examiner

*Primary Examiner* — Lan Vinh
(74) *Attorney, Agent, or Firm* — Thomas S. Deibert

(57) ABSTRACT

A chemical mechanical polishing composition useful for chemical mechanical polishing a semiconductor wafer containing an interconnect metal is provided, comprising, as initial components: water; an azole inhibitor; an alkali metal organic surfactant; a hydrotrope; a phosphorus containing agent; optionally, a non-saccharide water soluble polymer; optionally, a water soluble acid compound of formula I, wherein R is selected from a hydrogen and a $C_{1-5}$ alkyl group, and wherein x is 1 or 2; optionally, a complexing agent; optionally, an oxidizer; optionally, an organic solvent; and, optionally, an abrasive. Also, provided is a method for making a chemical mechanical polishing composition of the present invention and a method for chemical mechanical polishing of a substrate, comprising: providing a substrate, wherein the substrate is a semiconductor wafer having copper interconnects; providing a chemical mechanical polishing composition of the present invention; providing a chemical mechanical polishing pad; creating dynamic contact at an interface between the chemical mechanical polishing pad and the substrate with a down force of 0.69 to 34.5 kPa; and, dispensing the chemical mechanical polishing composition onto the chemical mechanical polishing pad at or near the interface between the chemical mechanical polishing pad and the substrate; wherein the chemical mechanical polishing composition exhibits a pH adjusted to a pH of 2 to 6 through the addition of at least one of phosphoric acid, magnesium hydroxide and lithium hydroxide.

9 Claims, No Drawings

STABLE, CONCENTRATABLE, WATER SOLUBLE CELLULOSE FREE CHEMICAL MECHANICAL POLISHING COMPOSITION

The present invention relates generally to the field of chemical mechanical polishing. In particular, the present invention is directed to a stabilized, concentratable, water soluble cellulose free chemical mechanical polishing composition; a method of making the chemical mechanical polishing composition and a method for chemical mechanical polishing of semiconductor materials and, more particularly to a method for chemical mechanical polishing of interconnect metals on semiconductor wafers.

Typically, a semiconductor wafer is a wafer of silicon with a dielectric layer containing multiple trenches arranged to form a pattern for circuit interconnects within the dielectric layer. The pattern arrangements usually have a damascene structure or dual damascene structure. A barrier layer covers the patterned dielectric layer and a metal layer covers the barrier layer. The metal layer has at least sufficient thickness to fill the patterned trenches with metal to form circuit interconnects.

Chemical mechanical polishing processes often include multiple polishing steps. For example, a first step removes excess interconnect metals, such as copper at an initial high rate. After the first step removal, a second step polishing can remove metal that remains on the barrier layer outside of the metal interconnects. Subsequent polishing removes the barrier from an underlying dielectric layer of a semiconductor wafer to provide a planar polished surface on the dielectric layer and the metal interconnects.

The metal in a trench or trough on the semiconductor substrate provides a metal line forming a metal circuit. One of the problems to be overcome is that the polishing operation tends to remove metal from each trench or trough, causing recessed dishing of such metal. Dishing is undesirable as it causes variations in the critical dimensions of the metal circuit. To reduce dishing, polishing is performed at a lower polishing pressure. However, merely reducing the polishing pressure would require that polishing continue for a lengthened duration. However, dishing would continue to be produced for the entire lengthened duration.

To provide enhanced tailorability for unique customer needs and to provide improved logistical properties (e.g., lower shipping costs, decreased volume throughput), it is often desirable to provide chemical mechanical polishing formulations in a concentrated form. The conventional chemical mechanical polishing formulations designed for use in removing excess interconnect metals typically incorporate an azole based inhibitor. Such azole based inhibitors exhibit a tendency to agglomerate and precipitate out of solution when incorporated at higher concentrations.

Comeau et al. disclose process for filtering BTA prior to its incorporation into polishing formulations. Specifically, Comeau et al. disclose a solution for forming a polishing slurry that may include 1H-benzotriazole (BTA) dissolved in an ionic surfactant such as a sodium alkyl sulfate solution, and perhaps a polyacrylic acid (PAA) solution. The solution can be filtered and used in a polishing slurry. This approach to solubilizing BTA results in a high BTA concentration in a polishing slurry without addition of foreign components to the slurry or increased safety hazard. In addition, the solution is easier to ship because it is very stable (e.g., can be frozen and thawed) and has less volume compared to conventional approaches. Further, the polishing slurry performance is vastly improved due to the removal of particles that can cause scratching.

The solution disclosed in Comeau et al. is a component that may be used in the manufacture of a chemical mechanical polishing formulation. Conventional chemical mechanical polishing formulations used for polishing semiconductor wafer metal interconnects, however, contain a variety of additional components to provide the formulation with the desired polishing properties. These additional components may also influence the stability of the final formulation upon concentration.

For example, Wang describes the use of an abrasive free copper formulation containing methyl cellulose, an acrylic acid/methacrylic acid copolymer, benzotriazole (BTA) and miscible solvent for patterned wafers in U.S. Pat. No. 7,086, 935. This formula is capable of removing and clearing copper with low copper dishing, but during rapid polishing, it precipitates a green Cu-BTA compound on the polishing pad and wafer. These precipitates require a post-polishing cleaning of the polishing pad to avoid a decrease in polishing removal rate associated with the gum-like precipitate; and they require a post-polishing cleaning of the wafer to avoid defect creation. These cleaning steps require strong and costly cleaning solutions and have an associated "cost of ownership" arising from the delayed wafer throughput.

An improved formulation, alleviating the green precipitate concern, is disclosed by Thomas in U.S. Patent Application Publication No. 2009/0215266. Thomas et al. disclose a method of polishing a patterned semiconductor wafer containing a copper interconnect metal with a polishing pad. The method includes the following: a) providing an aqueous polishing solution, the polishing solution containing a benzotriazole (BTA) inhibitor and a copper complexing compound and water; b) polishing the patterned wafer with the aqueous polishing solution and the polishing pad in a manner that dissolves copper into $Cu^{+1}$ ions, the $Cu^{+1}$ ions and BTA inhibitor having a concentration where $[BTA]*[Cu^{+1}]>Ksp$ for Cu-BTA precipitate if the aqueous solution did not contain the complexing compound; and c) oxidizing at least some of the copper ions to prevent the polishing solution from precipitating the Cu-BTA precipitate.

Many conventional chemical mechanical polishing formulations like those exemplified in Thomas et al., contain ammonium with its associated environmental and safety concerns both during manufacture and use of the polishing formulations. Also, many conventional chemical mechanical polishing formulations contain a water soluble cellulose material (e.g., carboxy methyl cellulose). Such cellulose materials frequently contain contaminants that may cause an increase in defectivity performance.

According, what is needed is a chemical mechanical polishing composition and method for chemical mechanical polishing of patterned semiconductor wavers containing metal interconnects, wherein the chemical mechanical polishing composition contains an azole inhibitor and is stably concentratable; and, preferably, is both ammonium free (i.e., <0.001 wt %) and water soluble cellulose free (i.e., <0.001 wt %).

The present invention provides a chemical mechanical polishing composition useful for chemical mechanical polishing a semiconductor wafer containing an interconnect metal, comprising (consists essentially of), as initial components: water; an azole inhibitor; an alkali metal organic surfactant; a hydrotrope; a phosphorus containing agent; optionally, a non-saccharide water soluble polymer; optionally, a water soluble acid compound of formula I:

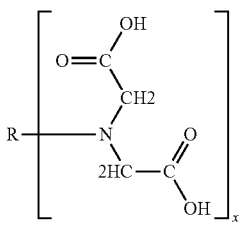

wherein R is selected from a hydrogen and a $C_{1-5}$ alkyl group, and wherein x is 1 or 2; optionally, a complexing agent; optionally, an oxidizer; optionally, an organic solvent; and, optionally, an abrasive.

The present invention provides a chemical mechanical polishing composition useful for chemical mechanical polishing a semiconductor wafer containing an interconnect metal, comprising (consists essentially of), as initial components: water; an azole inhibitor; an alkali metal organic surfactant; a hydrotrope; a phosphorus containing agent; optionally, a non-saccharide water soluble polymer; optionally, a water soluble acid compound of formula I, wherein R is selected from a hydrogen and a $C_{1-5}$ alkyl group, and wherein x is 1 or 2; optionally, a complexing agent; optionally, an oxidizer; optionally, an organic solvent; and, optionally, an abrasive; wherein the chemical mechanical polishing composition contains <0.001 wt % ammonium and wherein the chemical mechanical polishing composition contains <0.001 wt % water soluble cellulose.

The present invention provides a method for producing a chemical mechanical polishing composition of the present invention, comprising: providing water; providing an azole inhibitor; providing an alkali metal organic surfactant; providing a hydrotrope; providing a phosphorus containing agent; optionally, providing an optional non-saccharide water soluble polymer; optionally, providing an optional water soluble acid compound of formula I:

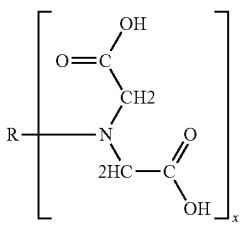

wherein R is selected from a hydrogen and a $C_{1-5}$ alkyl group, and wherein x is 1 or 2; optionally, providing an optional complexing agent; optionally, providing an optional oxidizer; optionally, providing an optional organic solvent; optionally, providing an optional abrasive; combining the water, the alkali metal organic surfactant, the hydrotrope, any optional non-saccharide water soluble polymer, any optional water soluble acid compound of formula I, any optional complexing agent, any optional oxidizer, any optional organic solvent and any optional abrasive forming a mixture; and, adding the azole inhibitor and the phosphorus containing agent to the mixture forming the chemical mechanical polishing composition.

The present invention provides a method for chemical mechanical polishing of a substrate, comprising: providing a substrate, wherein the substrate is a semiconductor wafer having copper interconnects; providing a chemical mechanical polishing composition according to the present invention; optionally, adding an oxidizer to the chemical mechanical polishing composition; providing a chemical mechanical polishing pad; creating dynamic contact at an interface between the chemical mechanical polishing pad and the substrate with a down force of 0.69 to 34.5 kPa; and dispensing the chemical mechanical polishing composition onto the chemical mechanical polishing pad at or near the interface between the chemical mechanical polishing pad and the substrate; wherein the chemical mechanical polishing composition exhibits a pH adjusted to a pH of 2 to 6 through the addition of at least one of phosphoric acid, magnesium hydroxide and lithium hydroxide.

The present invention provides a method for chemical mechanical polishing of a substrate, comprising: providing a substrate, wherein the substrate is a semiconductor wafer having copper interconnects; providing a chemical mechanical polishing composition according to the present invention as a concentrate; diluting the chemical mechanical polishing composition with water; optionally, adding an oxidizer to the chemical mechanical polishing composition; providing a chemical mechanical polishing pad; creating dynamic contact at an interface between the chemical mechanical polishing pad and the substrate with a down force of 0.69 to 34.5 kPa; and dispensing the chemical mechanical polishing composition onto the chemical mechanical polishing pad at or near the interface between the chemical mechanical polishing pad and the substrate; wherein the chemical mechanical polishing composition exhibits a pH adjusted to a pH of 2 to 6 through the addition of at least one of phosphoric acid, magnesium hydroxide and lithium hydroxide.

The present invention provides a method for chemical mechanical polishing of a substrate, comprising: providing a substrate, wherein the substrate is a semiconductor wafer having copper interconnects; providing a chemical mechanical polishing composition according to the present invention, wherein the chemical mechanical polishing composition is provided as a 4× concentrate; diluting the chemical mechanical polishing composition with water such that the loading of initial components following dilution are as follows: 0.2 to 0.4 wt % of benzotriazole; 0.05 to 1 wt % of sodium octane sulfonate; 0.45 to 1 wt % of a hydrotrope selected from sodium toluene sulfonate, sodium xylene sulfonate and mixtures thereof; 0.5 to 2 wt % of a phosphorus containing agent selected from tripotassium phosphate, dipotassium hydrogen phosphate, potassium dihydrogen phosphate and mixtures thereof; 0.05 to 1 wt % of a copolymer of methacrylic acid and acrylic acid; 0.4 to 2 wt % of iminodiacetic acid; and, 0.1 to 0.5 wt % of malic acid; adding an oxidizer to the chemical mechanical polishing composition; providing a chemical mechanical polishing pad; creating dynamic contact at an interface between the chemical mechanical polishing pad and the substrate with a down force of 0.69 to 34.5 kPa; and dispensing the chemical mechanical polishing composition onto the chemical mechanical polishing pad at or near the interface between the chemical mechanical polishing pad and the substrate; wherein the chemical mechanical polishing composition exhibits a pH adjusted to a pH of 2 to 6 through the addition of at least one of phosphoric acid, magnesium hydroxide and lithium hydroxide; and, wherein the chemical mechanical polishing composition exhibits a copper removal rate of at least 4,000 Å/min with a platen speed of 61 revolutions per minute, a carrier speed of 57 revolutions per minute, a chemical mechanical polishing composition flow rate of 200 ml/min, and a nominal down force of 13.8 kPa on a 200 mm polishing machine where the chemical mechanical polishing pad comprises a polyurethane polishing layer containing polymeric hollow core microparticles and a coated film subpad.

DETAILED DESCRIPTION

The chemical mechanical polishing composition of the present invention is stable when concentrated up to ≧4×, preferably up to ≧8×, its point of use concentration. This feature imparts significant value to the chemical mechanical polishing composition. It enables a smaller manufacturing footprint given the reduced process flows involved (i.e., reduced volume of water). It also enables lower transportation and storage costs. Finally, it provides enhanced flexibility for end users to customize the chemical mechanical polishing at the point of use to fit their unique operations.

The term "concentratable" used herein and in the appended claims in reference to the chemical mechanical polishing composition of the present invention means that the chemical mechanical polishing composition can be produced, stored and shipped with less water than is incorporated into the chemical mechanical polishing composition at the point of use.

The term "point of use" used herein and in the appended claims in reference to the chemical mechanical polishing composition refers to the chemical mechanical polishing composition at the point in time when it is used to polish a substrate.

The term "ammonium free" used herein and in the appended claims in reference to the chemical mechanical polishing composition, means that the chemical mechanical polishing composition contains <0.001 wt % ammonium (more preferably, <0.0001 wt % ammonium).

The term "water soluble cellulose free" used herein and in the appended claims in reference to the chemical mechanical polishing composition, means that the chemical mechanical polishing composition contains <0.001 wt % water soluble cellulose (more preferably, <0.0001 wt % water soluble cellulose).

The chemical mechanical polishing composition of the present invention is concentratable and remains stable in the concentrated form. For example, the chemical mechanical polishing composition of the present invention can be provided as a ≧4× point of use (preferably ≧8×) concentrate (see, e.g., Table 3 and accompanying text in the Examples). For the purpose of clarity, the chemical mechanical polishing composition of the present invention will be described in detail herein relative to its point of use composition. Notwithstanding, those of ordinary skill in the art will recognize how the formulation of the chemical mechanical polishing composition of the present invention would change for the concentrate (i.e., the chemical mechanical polishing composition in concentrated form).

Selection of the specific formulation of the chemical mechanical polishing composition used in the chemical mechanical polishing method of the present invention is key to providing target metal interconnect removal rates in combination with both concentratability and stability.

Substrate suitable for use in the chemical mechanical polishing method of the present invention for chemical mechanical polishing comprises a semiconductor substrate, preferably a semiconductor substrate having metal interconnects, such as copper or a copper alloy; more preferably, a semiconductor substrate having metal interconnects, such as copper or a copper alloy with an underlying dielectric layer.

The chemical mechanical polishing composition of the present invention preferably relies upon a balance of deionized or distilled water to limit incidental impurities.

The chemical mechanical polishing composition of the present invention contains an inhibitor to control removal of nonferrous metal, such as, a copper interconnect removal rate, by static etch or other removal mechanism. Adjusting the concentration of the inhibitor adjusts the interconnect metal removal rate by protecting the metal from static etch. Preferably, the chemical mechanical polishing composition contains 0.01 to 15 wt %, more preferably 0.1 to 5 wt %, still more preferably 0.2 to 0.4 wt % inhibitor. Most preferably, the chemical mechanical polishing composition contains 0.2 to 1.0 wt % inhibitor. Optionally, the inhibitor comprises a mixture of inhibitors. Preferably, the inhibitor is selected from azole inhibitors, which are particularly effective for polishing wafers having copper and silver interconnects. More preferably, the inhibitor is selected from benzotriazole (BTA), mercaptobenzotriazole (MBT), tolytriazole (TTA), imidazole and combinations thereof. Combinations of azole inhibitors can increase or decrease the copper removal rate. Most preferably, the inhibitor is BTA, which is a particularly effective inhibitor for copper and silver.

The chemical mechanical polishing composition of the present invention comprises a surfactant. Preferably, the chemical mechanical polishing composition comprises 0.01 to 5 wt %, more preferably 0.05 to 1 wt %, still more preferably 0.1 to 1 wt %, most preferably 0.2 to 0.8 wt % surfactant. Preferably, the surfactant is an alkali metal organic sulfonate. More preferably, the surfactant is an alkali metal organic sulfonate, wherein the alkali metal is selected from sodium, potassium, lithium and magnesium; and, wherein the organic is an aliphatic group having 2 to 16 carbon atoms. Still more preferably, the surfactant is selected from sodium octane sulfonate, potassium octane sulfonate, lithium octane sulfonate, sodium dodecane sulfonate, potassium dodecane sulfonate and lithium dodecane sulfonate. Most preferably, the surfactant is sodium octane sulfonate.

The chemical mechanical polishing composition of the present invention preferably comprises a hydrotrope. Preferably, the chemical mechanical polishing composition comprises 0.05 to 5 wt %, more preferably 0.1 to 5 wt %, still more preferably 0.1 to 1 wt %, most preferably 0.45 to 1 wt % hydrotrope. Preferably, the hydrotrope is selected from benzene sulfonate, alkylbenzene sulfonates (e.g., toluene sulfonate, cumene sulfonate) and dialkylbenzene sulfonates (e.g., xylene sulfonate, cymene sulfonate) and salts thereof. More preferably, the hydrotrope is selected from benzene sulfonate; toluene sulfonate; cumene sulfonate; xylene sulfonate; cymene sulfonate; and, sodium, lithium, calcium, potassium and ammonium salts thereof. Still more preferably in an ammonium free chemical mechanical polishing composition of the present invention, the hydrotrope is selected from benzene sulfonate; toluene sulfonate; cumene sulfonate; xylene sulfonate; cymene sulfonate; and, sodium, lithium, calcium and potassium salts thereof. Yet still more preferably, the hydrotrope is selected from sodium toluene sulfonate and sodium xylene sulfonate. Most preferably, the hydrotrope is sodium xylene sulfonate.

The chemical mechanical polishing composition of the present invention includes a phosphorus-containing compound. Preferably, the chemical mechanical polishing composition comprises 0.01 to 15 wt %; more preferably 0.05 to 10 wt %, still more preferably 0.1 to 5 wt %, most preferably 0.5 to 2 wt % phosphorous-containing compound. For purposes of this specification, a "phosphorus-containing" compound is any compound containing a phosphorus atom. Preferably, the phosphorus-containing compound is selected from a phosphate, pyrophosphate, polyphosphate, phosphonate, including, their acids, salts, mixed acid salts, esters, partial esters, mixed esters, and mixtures thereof. More preferably, the phosphorus-containing compound is selected from zinc phosphate, zinc pyrophosphate, zinc polyphosphate, zinc phosphonate, ammonium dihydrogen phosphate, diammonium hydrogen phosphate, triammonium phosphate, ammonium pyrophosphate, ammonium polyphosphate, ammonium phosphonate, diammonium phosphonate, diammonium pyrophosphate, diammonium polyphosphate, diammonium phosphonate, guanidine phosphate, guanidine pyrophosphate, guanidine polyphosphate, guanidine phosphonate, iron phosphate, iron pyrophosphate, iron polyphosphate, iron phosphonate, cerium phosphate, cerium pyrophosphate, cerium polyphosphate, cerium phosphonate, ethylene-diamine phosphate, piperazine phosphate, piperazine pyrophosphate, piperazine phosphonate, melamine phosphate, dimelamine phosphate, melamine pyrophosphate, melamine polyphosphate, melamine phosphonate, melam phosphate, melam pyrophosphate, melam polyphosphate, melam phosphonate, melem phosphate, melem pyrophosphate, melem polyphosphate, melem phosphonate, dicyanodiamide phosphate, urea phosphate, potassium phosphate, their acids, salts, mixed acid salts, esters, partial esters, mixed esters, and mixtures thereof. Still more preferably, the phosphorus-containing compound is selected from phosphine oxides, phosphine sulphides and phosphorinanes and of phosphonates, phosphites and phosphinates, their acids, salts, mixed acid salts, esters, partial esters and mixed esters. Yet more preferably, the phosphorus-containing compound is selected from triammonium phosphate, diammonium hydrogen phosphate, ammonium dihydrogen phosphate, tripotassium phosphate, dipotassium hydrogen phosphate, potassium dihydrogen phosphate and combinations thereof. Yet still more preferably, the phosphorus-containing compound is selected from ammonium dihydrogen phosphate, tripotassium phosphate, dipotassium hydrogen phosphate, potassium dihydrogen phosphate. Most preferably, the chemical mechanical polishing composition is ammonium free, wherein the phosphorus containing compound is selected from tripotassium phosphate, dipotassium hydrogen phosphate, potassium dihydrogen phosphate and mixtures thereof.

The chemical mechanical polishing composition of the present invention optionally contains a non-saccharide water soluble polymer. The chemical mechanical polishing composition contains 0 to 5 wt %, preferably 0.05 to 5 wt %, more preferably 0.05 to 3 wt %, most preferably 0.05 to 1 wt % non-saccharide water soluble polymers.

The non-saccharide water soluble polymers preferably include acrylic acid polymers, methacrylic polymers and copolymers synthesized utilizing acrylic acid monomer or methacrylic acid monomer. For purposes of this specification, the non-saccharide water soluble polymers also include polymers of various molecular weights and low molecular weight oligomers. Copolymers include those formed from a combination of acrylic acid and methacrylic acid; and in particular, copolymers formed from an acrylic acid to methacrylic acid mole ratio in a range of 1:30 to 30:1; preferably in a range of 1:9 to 9:1; and most preferably about 2:3. The copolymer preferably has a weight average molecular weight in the range of 1K to 1000K; preferably in the range of 10K to 500K.

Alternatively, the non-saccharide water soluble polymer is an amphiphilic polymer, such as a copolymer formed from acrylic acid or methacrylic acid. The amphiphilic polymers referred to in this specification are block copolymers comprised of a hydrophobic segment and a hydrophilic segment. The hydrophobic segment can be polymeric chains with a carbon number varying from 2 to 250. For purposes of this specification, carbon number represents the number of carbon atoms in the hydrophilic segment. Preferably, the carbon number is 5 to 100 and most preferably 5 to 50. The hydrophilic segment is ionic. The number of monomeric units of the hydrophilic segment preferably varies from 1 to 100.

The amphiphilic polymers' preferred number average molecular weight is 50 to 5,000—this specification refers to amphiphilic polymer in terms of number average molecular weight and specifically by aqueous gel permeation chromatography using TSK-GEL pn/08025 GMPWx and TSK-GEL pn/08020 G2500PWx columns in series with a refractive index detector and sodium phosphate buffer eluent. More preferably, the number average molecular weight is between 50 and 4,000 and most preferably the number average molecular weight is between 100 and 3,000. Ionic segments include cationic, anionic, and zwitterions (polyampholytes and polybetaines). Preferably, the hydrophilic segment is anionic such, as polyacrylic acid or a polymethacrylic acid. The hydrophilic segment preferably contains polyacrylic acid, polymethacrylic acid or a copolymer of acrylic acid and methacrylic acid. The combining of these segments into a copolymer produces molecules with properties different than their respective homopolymers that facilitate clearing without excessive dishing of metal interconnects. The hydrophobic end of the polymer may include hydrocarbon chains or an alkylmercaptan. Most preferably, the hydrophobic and hydrophilic segments combine in the form of a block copolymer.

The chemical mechanical polishing composition of the present invention optionally contains a water soluble acid compound according to formula I

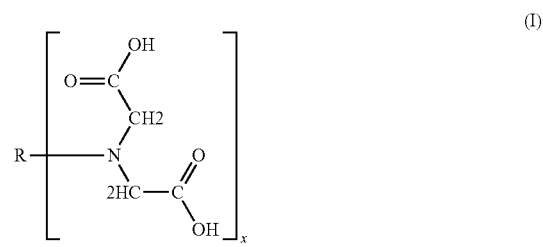

wherein R is selected from a hydrogen and a $C_{1-5}$ alkyl group, and wherein x is 1 or 2. Preferably, the chemical mechanical polishing composition contains 0 to 10 wt %; preferably 0.05 to 5 wt %, more preferably 0.4 to 2 wt % water soluble acid compound according to formula I. Preferably, the water soluble acid compound according to formula I is selected from iminodiacetic acid (IDA), ethylenediaminetetraacetic acid (EDTA), and combinations thereof. Most preferably, the water soluble acid compound according to formula I is IDA.

The water soluble acid compounds according to formula I are capable of complexing copper ions having a single valence$^{(+1)}$ and divalent$^{(+2)}$ copper ions. During polishing, the water soluble acid compound appears to complex with a sufficient number of copper ions to reduce the formation of Cu-BTA precipitate and control the rate of formation of $Cu^{+2}$ ions in expression (2) as follows:

$$2Cu^+ \rightarrow Cu^0 + Cu^{+2} \qquad (2)$$

For purposes of this specification Cu-BTA precipitate includes non-liquids such as solids, gels and polymers and may include $Cu^{+2}$ ions, spinel precipitates, spinel-like precipitates and impurities. From polishing experience, an insoluble Cu-BTA precipitate forms when the product of copper ion$^{(+1)}$ and BTA concentrations exceed the $K_{sp}$ under the polishing conditions. The precipitation of the Cu-BTA appears to occur in acidic polishing solutions following equilibrium expression (1):

$$BTAH + Cu^+ \underset{(fast)}{\overset{(slow)}{\rightleftarrows}} Cu\text{-}BTA + H^+ \quad (1)$$

The chemical mechanical polishing composition of the present invention optionally contains a complexing agent for the nonferrous metal. The complexing agent can facilitate the removal rate of the metal film, such as copper. Preferably, the chemical mechanical polishing composition contains 0 to 15 wt %, more preferably 0.01 to 5 wt %, still more preferably 0.1 to 5 wt %, most preferably 0.1 to 0.5 wt % complexing agent. Exemplary complexing agents include, for example, acetic acid, citric acid, ethyl acetoacetate, glycolic acid, lactic acid, malic acid, oxalic acid, salicylic acid, sodium diethyl dithiocarbamate, succinic acid, tartaric acid, thioglycolic acid, glycine, alanine, aspartic acid, ethylene diamine, trimethyl diamine, malonic acid, gluteric acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, tannic acid, including, salts and mixtures thereof. Preferably, the complexing agent is selected from acetic acid, citric acid, ethyl acetoacetate, glycolic acid, lactic acid, malic acid, oxalic acid and combinations thereof. Most preferably, the complexing agent is malic acid.

The chemical mechanical polishing composition of the present invention optionally contains an oxidizer. In some embodiments, the chemical mechanical polishing composition contains 0 to 25 wt %, preferably 1 to 15 wt %, more preferably 5 to 10 wt % oxidizer. In some embodiments, the oxidizer is selected from hydrogen peroxide ($H_2O_2$), monopersulfates, iodates, magnesium perphthalate, peracetic acid and other per-acids, persulfates, bromates, periodates, nitrates, iron salts, cerium salts, Mn (III), Mn (IV) and Mn (VI) salts, silver salts, copper salts, chromium salts, cobalt salts, halogens, hypochlorites and a mixture thereof. In some embodiments, the oxidizer is hydrogen peroxide. When the chemical mechanical polishing composition contains an unstable oxidizing agent such as, hydrogen peroxide, it is preferable to incorporate the oxidizer into the chemical mechanical polishing composition at the point of use.

The chemical mechanical polishing composition of the present invention optionally contains a water miscible alcohol or ketone. The water miscible alcohols or ketones, in the presence of a modified cellulose compound, helps to facilitate an acceptable metal removal rate and clearing of the copper metal with low dishing. Typically, water miscible alcohols or ketones include at least one of methanol, ethanol, 1-propanol, 2-propanol, ethylene glycol, 1,2-propanediol, glycerol, acetone, and methyl ethyl ketone. Preferably, the composition contains 0 to 10 wt %, more preferably 0.005 to 10 wt %, still more preferably 0.01 to 7.5 wt %, most preferably 0.02 to 5 wt % of water miscible alcohol or ketone.

The chemical mechanical polishing composition of the present invention optionally contains 0 to 3 wt % abrasive to facilitate metal layer removal. Within this range, it is desirable to have the abrasive present in an amount of less than or equal to 1 weight percent. Most preferably, the polishing compositions are abrasive-free.

The abrasive has an average particle size of less than or equal to 500 nanometers (nm) for preventing excessive metal dishing, dielectric erosion and improving planarization. For purposes of this specification, particle size refers to the average particle size of the abrasive. More preferably, it is desirable to use a colloidal abrasive having an average particle size of less than or equal to 100 nm. Further, decreased dielectric erosion and metal dishing occur with colloidal silica having an average particle size of less than or equal to 70 nm. In addition, the preferred colloidal abrasive may include additives, such as dispersants, surfactants, buffers, and biocides to improve the stability of the colloidal abrasive. One such colloidal abrasive is colloidal silica from Clariant S.A., of Puteaux, France. Also, other abrasives, including, those that are fumed, precipitated, agglomerated, etc., may be utilized.

The chemical mechanical polishing composition optionally includes abrasive for "mechanical" removal of metal interconnect layers. Example abrasives include inorganic oxides, inorganic hydroxides, inorganic hydroxide oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), titanium oxide ($TiO_2$) or combinations comprising at least one of the foregoing oxides. Suitable inorganic hydroxide oxides include, for example, aluminum hydroxide oxide ("boehmite"). Modified forms of these inorganic oxides, such as, organic polymer-coated inorganic oxide particles and inorganic coated particles may also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Diamond may also be utilized as an abrasive if desired. Alternative abrasives also include polymeric particles, coated polymeric particles, and surfactant stabilized particles. The preferred abrasive, if utilized, is silica.

The chemical mechanical polishing composition of the present invention provides efficacy over a broad pH range. The useful pH range of the chemical mechanical polishing composition of the present invention extends from at 2 to 5. In some embodiments of the present invention, the chemical mechanical polishing composition exhibits a pH of 2 to 5, preferably 2 to 4, more preferably 2.5 to 4 at the point of use. Acids suitable for use adjusting the pH of the chemical mechanical polishing composition of the present invention include, for example, nitric acid, sulfuric acid, hydrochloric acid, and phosphoric acid; preferably phosphoric acid. Bases suitable for use adjusting the pH of the chemical mechanical polishing composition of the present invention include, for example, ammonium hydroxide, magnesium hydroxide, lithium hydroxide and potassium hydroxide. Preferably, the chemical mechanical polishing composition of the present invention is ammonium free, wherein bases suitable for adjusting the pH are selected from magnesium hydroxide and lithium hydroxide.

The chemical mechanical polishing composition of the present invention preferably exhibits storage stability in concentrated form (i.e., at $\geq 4\times$ point of use concentration; more preferably at $\geq 8\times$ point of use concentration). The term "storage stability" as used herein and in the appended claims means that the concentrate remains visibly clear and there are no observed solids precipitated from the concentrate following storage at 5° C. for at least 5 days.

In the method of producing a chemical mechanical polishing composition of the present invention, the various initial components of the chemical mechanical polishing composition are preferably combined together with an order of addition that maximizes the volume of water into which the azole inhibitor and the phosphorus containing agent are added. Most preferably, the azole inhibitor and the phosphorus containing agent are the last components to be added in the preparation of the chemical mechanical polishing composition of the present invention.

Preferably, in the method of the present invention for chemical mechanical polishing of a substrate, comprises: providing a substrate; providing a chemical mechanical polishing composition according to the present invention; optionally, adding an oxidizer to the chemical mechanical polishing composition; providing a chemical mechanical polishing pad; creating dynamic contact at an interface between the chemical mechanical polishing pad and the substrate with a down force of 0.69 to 34.5 kPa; and dispensing the chemical mechanical polishing composition onto the chemical mechanical polishing pad at or near the interface between the chemical mechanical polishing pad and the substrate; wherein the chemical mechanical polishing composition exhibits a pH adjusted to a pH of 2 to 6 through the addition of at least one of phosphoric acid, magnesium hydroxide and lithium hydroxide. The substrate is a semiconductor substrate. Preferably the substrate is a semiconductor substrate having metal interconnects, such as such as copper, silver, aluminum, tungsten, platinum, palladium, gold, iridium and alloys thereof (more preferably copper or a copper alloy). Still more preferably, the substrate is a semiconductor substrate having metal interconnects with an underlying dielectric layer. Most preferably, the substrate is a semiconductor substrate having copper interconnects with an underlying dielectric layer. For purposes of this specification, the term dielectric refers to a semi-conducting material of dielectric constant, k, which includes low-k and ultra-low k dielectric materials. The chemical mechanical polishing composition and method of the present invention are excellent for preventing erosion of multiple wafer constituents, for example, porous and nonporous low-k dielectrics, organic and inorganic low-k dielectrics, organic silicate glasses (OSG), fluorosilicate glass (FSG), carbon doped oxide (CDO), tetraethylorthosilicate (TEOS) and a silica derived from TEOS. The chemical mechanical polishing composition of the present invention can also be used for ECMP (Electrochemical Mechanical Polishing).

Preferably, in the method of the present invention, the chemical mechanical polishing composition of the present invention is provided as a concentrate (more preferably as a $\geq$4× point of use concentrate; most preferably as a $\geq$8× point of use concentrate); wherein the method further comprises: diluting the chemical mechanical polishing composition with water; optionally, adding an oxidizer to the chemical mechanical polishing composition; providing a chemical mechanical polishing pad; creating dynamic contact at an interface between the chemical mechanical polishing pad and the substrate with a down force of 0.69 to 34.5 kPa; and dispensing the chemical mechanical polishing composition onto the chemical mechanical polishing pad at or near the interface between the chemical mechanical polishing pad and the substrate; wherein the chemical mechanical polishing composition exhibits a pH adjusted to a pH of 2 to 6 through the addition of at least one of phosphoric acid, magnesium hydroxide and lithium hydroxide.

Preferably, in the method of the present invention, the chemical mechanical polishing of a substrate, comprising: providing a substrate, wherein the substrate is a semiconductor wafer having copper interconnects; providing a chemical mechanical polishing composition according to the present invention, wherein the chemical mechanical polishing composition is provided as an 8× concentrate; diluting the chemical mechanical polishing composition with water such that the loading of initial components following dilution are as follows: 0.2 to 0.4 wt % of benzotriazole; 0.05 to 1 wt % of sodium octane sulfonate; 0.45 to 1 wt % of a hydrotrope selected from sodium toluene sulfonate, sodium xylene sulfonate and mixtures thereof; 0.5 to 2 wt % of a phosphorus containing agent selected from tripotassium phosphate, dipotassium hydrogen phosphate, potassium dihydrogen phosphate and mixtures thereof; 0.05 to 1 wt % of a copolymer of methacrylic acid and acrylic acid; 0.4 to 2 wt % of iminodiacetic acid; and, 0.1 to 0.5 wt % of malic acid; adding an oxidizer to the chemical mechanical polishing composition; providing a chemical mechanical polishing pad; creating dynamic contact at an interface between the chemical mechanical polishing pad and the substrate with a down force of 0.69 to 34.5 kPa; and dispensing the chemical mechanical polishing composition onto the chemical mechanical polishing pad at or near the interface between the chemical mechanical polishing pad and the substrate; wherein the chemical mechanical polishing composition exhibits a pH adjusted to a pH of 2 to 6 through the addition of at least one of phosphoric acid, magnesium hydroxide and lithium hydroxide; and, wherein the chemical mechanical polishing composition exhibits a copper removal rate of at least 4,000 Å/min with a platen speed of 61 revolutions per minute, a carrier speed of 57 revolutions per minute, a chemical mechanical polishing composition flow rate of 200 ml/min, and a nominal down force of 13.8 kPa on a 200 mm polishing machine where the chemical mechanical polishing pad comprises a polyurethane polishing layer containing polymeric hollow core microparticles and a coated film subpad.

The chemical mechanical polishing composition and method of the present invention are particularly useful for chemical mechanical polishing of semiconductor wafers having copper interconnects, preferably having copper interconnects with an underlying dielectric layer. Notwithstanding, it is believed that the chemical mechanical polishing composition of the present invention are also suitable for polishing semiconductor wafers containing other conductive metal interconnects, such as aluminum, tungsten, platinum, palladium, gold, or iridium; a barrier or liner film, such as tantalum, tantalum nitride, titanium, or titanium nitride; and an underlying dielectric layer. For purposes of the specification, the term dielectric refers to a semi-conducting material of dielectric constant, k, which includes low-k and ultra-low k dielectric materials. The chemical mechanical polishing composition and method of the present invention are excellent for preventing erosion of multiple wafer constituents, for example, porous and nonporous low-k dielectrics, organic and inorganic low-k dielectrics, organic silicate glasses (OSG), fluorosilicate glass (FSG), carbon doped oxide (CDO), tetraethylorthosilicate (TEOS) and a silica derived from TEOS. The chemical mechanical polishing composition of the present invention can also be used for ECMP (Electrochemical Mechanical Polishing).

Some embodiments of the present invention will now be described in detail in the following Examples.

COMPARATIVE EXAMPLE A AND EXAMPLES 1-7

Chemical Mechanical Polishing Composition Preparation

The chemical mechanical polishing compositions used in Comparative Polishing Example PA and Polishing Examples P1-P7 and the Comparative Stability Example SA and Stability Examples S1-S7 (namely chemical mechanical polishing compositions A and 1-7 respectively) were prepared by combining the components in the amounts listed in TABLE 1 (and for the Comparative Polishing Example A and Polishing Examples S1-S7 further adding $H_2O_2$ to a concentration of 9 wt %).

Stability

The stability of the polishing compositions noted in TABLE 3 was assessed by storing the noted samples at the noted temperatures for five days and observing the clarity of the

TABLE 1

| Ex. | BTA (in g) | Malic Acid (in g) | CMC$^\zeta$ (in g) | Copoly$^\pounds$ (in g) | IDA$^\epsilon$ (in g) | $K_3PO_4$ (99%) (in g) | $H_3PO_4$ (85%) (in g) | SOS$^\yen$ (in g) | SXS$^\pi$ (in g) | $Mg(OH)_2$ (in g) | KOH (in g) | LiOH (in g) | DI Water (in g) | Conc.$^\alpha$ | Final pH |
|---|---|---|---|---|---|---|---|---|---|---|---|---|---|---|---|
| A | 21.43 | 15.72 | 457.1 | 57.14 | 92.86 | 86.49 | 94.85 | 18.80 | — | — | 103.18 | — | 4052.44 | 1X | 4.2 |
| 1 | 25.73 | 18.86 | — | 68.57 | 111.43 | 103.79 | 113.82 | 22.56 | 22.50 | — | — | 23.88 | 988.88 | 4X | 3.93 |
| 2 | 25.72 | 18.86 | — | 68.57 | 111.43 | 103.79 | 113.82 | 59.21 | 15.00 | — | — | 23.88 | 959.73 | 4X | 3.93 |
| 3 | 25.72 | 18.86 | — | 68.57 | 111.43 | 103.79 | 113.82 | 39.47 | 18.00 | — | — | 23.88 | 976.47 | 4X | 3.93 |
| 4 | 27.43 | 20.12 | — | 73.14 | 118.85 | 110.71 | 121.41 | 24.07 | 24.00 | 30.78 | — | — | 1049.50 | 4X | 4.31 |
| 5 | 27.43 | 20.12 | — | 73.14 | 118.85 | 110.71 | 121.41 | 24.07 | 32.00 | 30.78 | — | — | 1041.50 | 4X | 3.46 |
| 6 | 27.43 | 20.12 | — | 73.14 | 118.85 | 110.71 | 121.41 | 24.07 | 40.00 | 30.78 | — | — | 1033.50 | 4X | 3.91 |
| 7 | 27.43 | 20.12 | — | 73.14 | 118.85 | 110.71 | 121.41 | 24.07 | 48.00 | 30.78 | — | — | 1025.50 | 4X | 4.1 |

$^\zeta$5 wt % carboxy methyl cellulose 200k weight average molecular weight
$^\pounds$25 wt % copolymer of acrylic acid and methacrylic acid (2:3 mol ratio, 23k weight average molecular weight)
$^\epsilon$Iminodiacetic acid
$^\yen$38 wt % sodium octane sulfonate (available from Stepan Company, Bio-Terge ® PAS-8S)
$^\pi$Sodium xylene sulfonate solid
$^\alpha$Concentrate of the formulation (1X = point of use concentration)

COMPARATIVE POLISHING EXAMPLE PA AND POLISHING EXAMPLES P1-P7

Polishing experiments were performed on copper blanket wafers in each instance using the formulation noted in TABLE 2 (concentrated formulations were diluted to 1×POU concentration before polishing). An Applied Materials, Inc. Reflexion 200 mm polishing machine equipped with an ISRM detector system using an VisionPad™ 5000 polyurethane polishing pad with a K7 groove pattern available from Rohm and Haas Electronic Materials CMP Inc. under down force conditions of 2.0 psi (13.8 kPa), a polishing solution flow rate of 200 ml/min, a platen speed of 61 RPM, and a carrier speed of 57 RPM with a polishing solution drop point at 3.5 inches (8.89 cm) from the center of the polishing pad. A Diagrid® AD3BG-150855 diamond pad conditioner (commercially available from Kinik Company) was used to condition the polishing pad. The polishing pad was broken in with the conditioner using a down force of 9.0 psi (62.1 kPa) for 20 minutes then with a down force of 7.0 psi (48.3 kPa) for 20 minutes before polishing. The polishing pad was further conditioned between wafers using a down force of 7.0 psi (48.3 kPa). The copper removal rates were determined using a Jordan Valley JVX-5200T metrology tool. Each of the polishing experiments was performed in duplicate. The average of the two results are provided in TABLE 2.

TABLE 2

| Ex. | Polishing Composition | Cu Removal Rate (Å/min.) |
|---|---|---|
| PA | Comparative Example A | 6667 |
| P1 | Example 1 | 6786 |
| P2 | Example 2 | 6380 |
| P3 | Example 3 | 6489 |
| P4 | Example 4 | 5533 |
| P5 | Example 5 | 6214 |
| P6 | Example 6 | 6205 |
| P7 | Example 7 | 6128 | aged material. Unstable formulations will be observed to become cloudy or form a precipitate upon storage under the noted conditions.

TABLE 3

| Ex. | Polishing Comp. | Conc. | Temp. | Stable |
|---|---|---|---|---|
| S1 | Ex. 1 | 4X | 55° C. | yes |
| S2 | Ex. 2 | 4X | 55° C. | yes |
| S3 | Ex. 3 | 4X | 55° C. | yes |
| S4 | Ex. 4 | 4X | 55° C. | yes |
| S5 | Ex. 5 | 4X | 55° C. | yes |
| S6 | Ex. 6 | 4X | 55° C. | yes |
| S7 | Ex. 7 | 4X | 55° C. | yes |

We claim:
1. A chemical mechanical polishing composition useful for chemical mechanical polishing a semiconductor wafer containing an interconnect metal, comprising, as initial components:
water;
0.1 to 5 wt % of an azole inhibitor;
0.05 to 1 wt % of an alkali metal organic surfactant;
0.05 to 5 wt % of a hydrotrope;
0.1 to 5 wt % of a phosphorus containing agent;
0.05 to 5 wt % of a non-saccharide water soluble polymer;
0.05 to 5 wt % of a water soluble acid compound of formula I:

$$R \left[ N \begin{array}{c} CH_2-C(=O)OH \\ 2HC-C(=O)OH \end{array} \right]_x \quad (I)$$

wherein R is selected from a hydrogen and a $C_{1-5}$ alkyl group, and wherein x is 1 or 2;
0.01 to 5 wt % of a complexing agent;
0 to 25 wt % of an oxidizer;
0 to 10 wt % of an organic solvent; and,
optionally, an abrasive.

2. The chemical mechanical polishing composition of claim 1, wherein the chemical mechanical polishing composition contains <0.001 wt % ammonium and wherein the chemical mechanical polishing composition contains <0.001 wt % water soluble cellulose.

3. A method for producing a chemical mechanical polishing composition according to claim 1, comprising:
providing water;
providing an azole inhibitor;
providing an alkali metal organic surfactant;
providing a hydrotrope;
providing a phosphorus containing agent;
providing a non-saccharide water soluble polymer;
providing a water soluble acid compound of formula I:

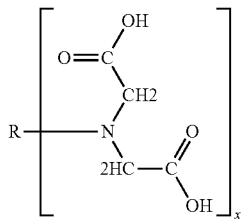

wherein R is selected from a hydrogen and a $C_{1-5}$ alkyl group, and wherein x is 1 or 2;
providing a complexing agent;
optionally, providing an optional oxidizer;
optionally, providing an optional organic solvent;
optionally, providing an optional abrasive;
combining the water, the alkali metal organic surfactant, the hydrotrope, the non-saccharide water soluble polymer, the water soluble acid compound of formula I, the complexing agent, any optional oxidizer, any optional organic solvent and any optional abrasive forming a mixture; and,
adding the azole inhibitor and the phosphorus containing agent to the mixture forming the chemical mechanical polishing composition.

4. The chemical mechanical polishing composition of claim 1, wherein the chemical mechanical polishing composition comprises, as initial components:
water;
0.1 to 5 wt % of benzotriazole;
0.05 to 1 wt % of sodium octane sulfonate;
0.1 to 1 wt % of a hydrotrope selected from sodium toluene sulfonate, sodium xylene sulfonate and mixtures thereof;
0.1 to 5 wt % of a phosphorus containing agent selected from tripotassium phosphate, dipotassium hydrogen phosphate, potassium dihydrogen phosphate and mixtures thereof; and,
0.05 to 3 wt % of a copolymer of methacrylic acid and acrylic acid;
0.05 to 5 wt % of iminodiacetic acid;
0.1 to 5 wt % of malic acid; and,
0 to 25 wt % of an oxidizer.

5. The chemical mechanical polishing composition of claim 4, wherein the chemical mechanical polishing composition contains <0.001 wt % ammonium.

6. A method for chemical mechanical polishing of a substrate, comprising:
providing a substrate, wherein the substrate is a semiconductor wafer having copper interconnects;
providing a chemical mechanical polishing composition according to claim 1;
optionally, adding an oxidizer to the chemical mechanical polishing composition;
providing a chemical mechanical polishing pad;
creating dynamic contact at an interface between the chemical mechanical polishing pad and the substrate with a down force of 0.69 to 34.5 kPa; and
dispensing the chemical mechanical polishing composition onto the chemical mechanical polishing pad at or near the interface between the chemical mechanical polishing pad and the substrate;
wherein the chemical mechanical polishing composition exhibits a pH adjusted to a pH of 2 to 6 through the addition of at least one of phosphoric acid, magnesium hydroxide and lithium hydroxide.

7. The method of claim 6, wherein the chemical mechanical polishing composition provided is in a concentrated form; and wherein the method further comprises:
diluting the chemical mechanical polishing composition with water.

8. The method of claim 7, wherein the chemical mechanical polishing composition exhibits a copper removal rate of at least 4,000 Å/min with a platen speed of 61 revolutions per minute, a carrier speed of 57 revolutions per minute, a chemical mechanical polishing composition flow rate of 200 mL/min, and a nominal down force of 13.8 kPa on a 200 mm polishing machine where the chemical mechanical polishing pad comprises a polyurethane polishing layer containing polymeric hollow core microparticles and a coated film subpad.

9. The method of claim 6, wherein the chemical mechanical polishing composition is provided as an 4× concentrate; and wherein the method further comprises:
diluting the chemical mechanical polishing composition with water such that the loading of initial components following dilution are as follows:
0.2 to 0.4 wt % of benzotriazole;
0.05 to 1 wt % of sodium octane sulfonate;
0.45 to 1 wt % of a hydrotrope selected from sodium toluene sulfonate, sodium xylene sulfonate and mixtures thereof;
0.5 to 2 wt % of a phosphorus containing agent selected from tripotassium phosphate, dipotassium hydrogen phosphate, potassium dihydrogen phosphate and mixtures thereof;
0.1 to 1 wt % of carboxy methyl cellulose;
0.05 to 1 wt % of a copolymer of methacrylic acid and acrylic acid;
0.4 to 2 wt % of iminodiacetic acid; and,
0.1 to 0.5 wt % of malic acid; and,
adding an oxidizer to the chemical mechanical polishing composition.

* * * * *